US008049944B2

(12) United States Patent
Moidu

(10) Patent No.: US 8,049,944 B2
(45) Date of Patent: Nov. 1, 2011

(54) MEMS DEVICE AND A MEMS DEVICE ARRAY

(75) Inventor: Abdul Jaleel K. Moidu, Nepean (CA)

(73) Assignee: JDS Uniphase Corporation, Milpitas, CA (US)

( * ) Notice: Subject to any disclaimer, the term of this patent is extended or adjusted under 35 U.S.C. 154(b) by 274 days.

(21) Appl. No.: 12/389,399

(22) Filed: Feb. 20, 2009

(65) Prior Publication Data
US 2010/0172612 A1  Jul. 8, 2010

Related U.S. Application Data

(63) Continuation-in-part of application No. 11/945,307, filed on Nov. 27, 2007, now Pat. No. 7,715,076.

(60) Provisional application No. 60/867,841, filed on Nov. 30, 2006, provisional application No. 61/030,678, filed on Feb. 22, 2008.

(51) Int. Cl.
 *G02B 26/08* (2006.01)
(52) U.S. Cl. ............... 359/199.4; 359/202.1
(58) Field of Classification Search .......... 359/199.4, 359/200.8, 202.1, 221.2, 223.1, 224.1, 225.1
 See application file for complete search history.

(56) References Cited

U.S. PATENT DOCUMENTS

| 6,498,872 | B2 | 12/2002 | Bouevitch et al. ............ 385/24 |
| 6,707,959 | B2 | 3/2004 | Ducellier et al. ............ 385/17 |
| 6,914,711 | B2 * | 7/2005 | Novotny et al. ............ 359/291 |
| 6,934,439 | B2 * | 8/2005 | Mala et al. ............ 385/18 |
| 6,968,101 | B2 * | 11/2005 | Miller et al. ............ 385/18 |
| 7,010,188 | B2 * | 3/2006 | Miller et al. ............ 385/18 |
| 7,014,326 | B2 | 3/2006 | Danagher et al. ............ 359/615 |
| 7,110,635 | B2 * | 9/2006 | Miller et al. ............ 385/18 |
| 7,110,637 | B2 * | 9/2006 | Ma et al. ............ 385/18 |
| 2002/0150324 | A1 * | 10/2002 | Laor ............ 385/16 |
| 2005/0156482 | A1 * | 7/2005 | Greywall ............ 310/309 |

OTHER PUBLICATIONS

Fujino et al. "Monolithically Cascaded Micromirror Pair Driven by Angular Vertical Combs for Two-Axis Scanning" IEEE Journal of Selected Topics in Quantum Electronics, vol. 10, No. 3, May/Jun. 2004, pp. 492-497.
Piyawattanametha et al. "Surface- and Bulk- Micromachined Two-Dimensional Scanner Driven by Angular Vertical Comb Actuators" Journal of Microelectromechanical Systems, vol. 14, No. 6, Dec. 2005 pp. 1329-1338.

* cited by examiner

*Primary Examiner* — Frank Font
(74) *Attorney, Agent, or Firm* — Teitelbaum & MacLean; Neil Teitelbaum; Doug MacLean

(57) ABSTRACT

A two-axis tiltable linear array of MEMS micromirrors is described. The individual micromirrors of the array are flexibly suspended over a common substrate by using two pairs of serpentine hinges coupled by a gimbal ring and are actuated by using tilt and roll electrodes. The tilt actuator regions of the micromirrors are disposed within the gimbal rings, the roll hinges connecting the tilt actuator regions to the micromirrors, which provides for decoupling of the tilt and the roll of the micromirror. The structure allows for considerable decoupling of the tilt and the roll and, or the pistoning effects observed upon micromirror actuation. The structure is suitable for application in a wavelength selective optical switch.

19 Claims, 10 Drawing Sheets

View D - D

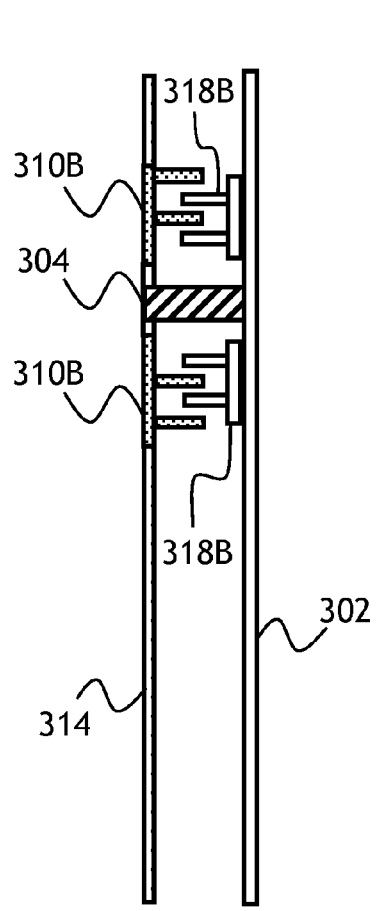
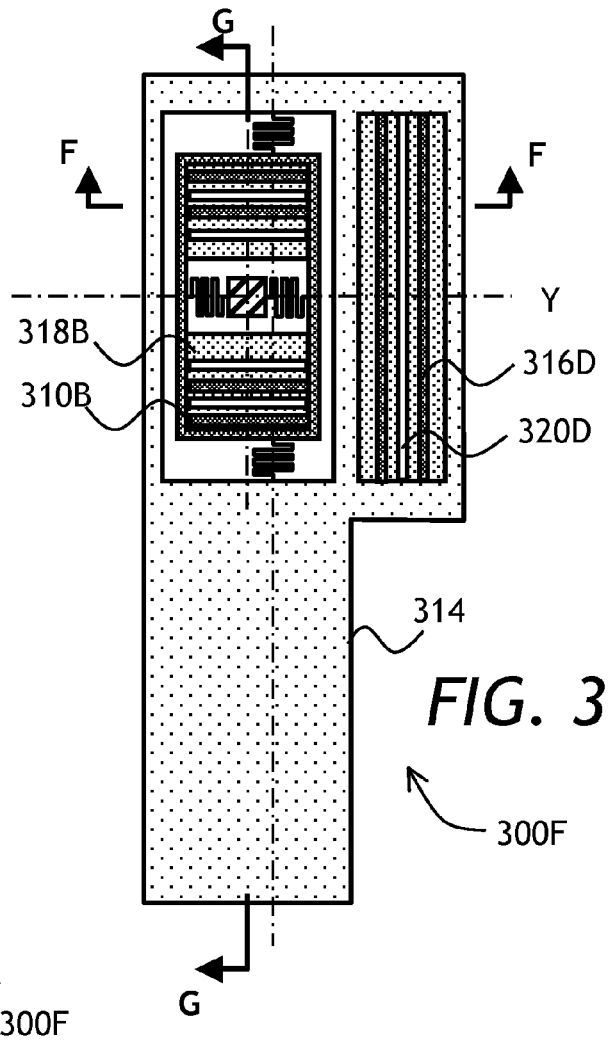
FIG. 3K
FIG. 3J
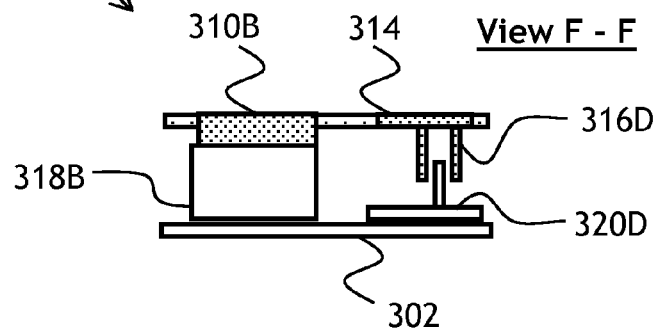
FIG. 3L

MEMS DEVICE AND A MEMS DEVICE ARRAY

CROSS-REFERENCE TO RELATED APPLICATIONS

The present invention is a continuation-in-part of U.S. patent application Ser. No. 11/945,307 filed Nov. 27, 2007 now U.S. Pat. No. 7,715,076, which claims priority from U.S. Provisional Patent Application Ser. No. 60/867,841 filed Nov. 30, 2006; and the present application claims priority from U.S. Provisional Patent Application Ser. No. 61/030,678 filed Feb. 22, 2008, all of which are incorporated herein by reference for all purposes.

TECHNICAL FIELD

The present invention relates to a micro-electro-mechanical (MEMS) device including an array of tilting platforms actuated by electrodes, and in particular to a linear array of MEMS micromirrors, wherein each micromirror is tiltable about two orthogonal axes.

BACKGROUND OF THE INVENTION

A micro-electromechanical system (MEMS) is a micro-sized mechanical structure having electrical circuitry fabricated together with the device by using microfabrication processes mostly derived from integrated circuit fabrication processes. The developments in the field of MEMS process engineering enabled batch production of electrostatically tiltable MEMS micromirrors and micromirror arrays that can be used in visual displays, optical attenuators and switches, and other devices. There are at least three general micromachining techniques used to manufacture MEMS micromirror devices.

One such technique is based on so called bulk micromachining, in which the whole thickness of a silicon wafer is used for building micro-mechanical structures. Silicon is machined using various etching processes. Anodic bonding of glass plates or additional silicon wafers is used for adding features in the third dimension and for hermetic encapsulation. Three-dimensional mechanical micro-structures can be created using bulk micromachining. Detrimentally, the bulk micromachining technique is very complex and requires many process steps.

Another technique is based on so called surface micromachining, in which layers are deposited on the surface of a substrate as the structural materials to be patterned, instead of a three-dimensional processing of the substrate itself, which significantly simplifies the manufacturing processes involved. The original surface micromachining concept was based on thin polycrystalline silicon layers patterned as movable mechanical structures and released by sacrificial etching of an underlying oxide layer. This MEMS paradigm has enabled the manufacturing of low cost MEMS devices.

New etching technology of deep reactive ion etching (RIE) has made it possible to combine performance and versatility of bulk micromachining with in-plane operation of surface micromachining. This combination formed a basis of a third micromachining technique called high aspect ratio (HAR) micromachining. While it is common in surface micromachining to have structural layer thickness in the range of 2 microns, in HAR micromachining, the achievable thickness of MEMS devices is from 10 to 100 microns. The materials commonly used in HAR micromachining are thick polycrystalline silicon, known as epi-poly, and bonded silicon-on-insulator (SOI) wafers. Due to its versatility and efficiency, this combined technology is quickly becoming the technology of choice for manufacturing MEMS tiltable micromirror devices.

MEMS tiltable micromirror devices are often used in optical switch applications. When a MEMS device is actuated, a micromirror supported by the device is tilted about a working axis, which makes an optical beam falling thereupon to steer from one output optical port to another, thereby realizing the switching function. By having a plurality of output ports disposed along a single line, a multiport optical switch can be constructed. In a multiport optical switch, however, it is advantageous to have the micromirror also tiltable about a secondary axis perpendicular to the working axis, so that the micromirror can be tilted about the secondary axis during the switching process, to deflect the optical beam laterally and avoid transient optical signals from briefly appearing in output ports that are on the way of the optical beam being steered towards a desired optical port. Therefore, having a MEMS micromirror device tiltable about a pair of mutually orthogonal axes is highly desirable and advantageous from the standpoint of an optical switch application.

MEMS devices can be actuated using a variety of actuators. One frequently used actuator for a MEMS device is an electrostatic actuator having a static electrode called a "stator", and a movable, for example rotatable or tiltable, electrode called a "rotor". An electrostatic attraction force between the stator and the rotor, applied against a returning force of a spring and, or a hinge element on which the rotor is suspended, tilts or rotates the rotor supporting a micromirror, whereby the micromirror is tilted in a controllable, predictable way. A special care is taken not to exceed the elastic limit of the spring and, or the hinge element. When the elastic limit is not exceeded, millions or even billions of tilting cycles are achievable over a lifetime of a single MEMS device.

Perhaps the simplest electrostatic actuator is a pair of planar plates, one being the stator and the other being the rotor. As the plates attract, the rotor plate tilts and is brought closer to the stator. By making the rotor plate tiltable about two orthogonal axes, e.g. X and Y axes, and by providing two stator plates, one for each axis of rotation, a micromirror attached to the rotor plate can be made electrostatically tiltable in two orthogonal axes of rotation. For example, U.S. Pat. No. 6,934,439 in the name of Mala et al., assigned to JDS Uniphase Corporation and incorporated herein by reference, teaches a linear array of tightly-spaced "piano" MEMS micromirror devices for use in a wavelength-selective optical switch application. Each micromirror of the MEMS micromirror array of Mala et al. is tiltable about two perpendicular axes X and Y, by the use of two stator plates, one for each axis of tilt, and by the use of two pairs of torsional hinges connected to an "internal" gimbal ring structure at the center of the micromirror. The flexible torsional hinges of Mala et al. provide for a pivotal mounting of the micromirrors, wherein each micromirror is independently tiltable.

Referring to FIG. 1, a top view of a prior-art tiltable MEMS device 100 of Mala et al. is shown having a platform 102 for supporting a micromirror, not shown, an anchor post 104 for supporting the platform 102, a Y-hinge 106 rotatable about a Y axis, a gimbal ring 108, an X-hinge 110 rotatable about an X axis, two Y-electrodes 112 for tilting the platform 102 about the Y-axis, and an X-electrode 114 for tilting the platform 102 about the X-axis. The electrodes 112 and 114, as well as the anchor post 104, are disposed on a substrate 116. The hinges 106 and 110, although shown by straight lines for simplicity, are serpentine spring hinges the platform 102 is suspended upon. The platform 102 is suspended over the substrate 116.

In operation, a voltage is applied between the platform 102 and one of the electrodes 112 to tilt the platform 102 about the Y axis, and a voltage is applied between the platform 102 and the electrode 114 to tilt the platform 102 about the X axis. Tilting the platform 102 about the two orthogonal axes X and Y allows for a two-dimensional steering of an optical beam reflected from a mirror coating, not shown, of the platform 102.

Limitations of the MEMS device 100 of the prior art and, correspondingly, many advantages offered by a MEMS device of the present invention, are better understood upon considering a typical task of steering of an optical beam by a MEMS micromirror for a wavelength selective optical switch application. Turning now to FIG. 2, an orthographic projection view of a MEMS micromirror 200 is presented, consisting of a plan View A and orthogonal side Views B and C. The micromirror 200 is tiltable about a Y axis and an X axis. An incoming optical beam 202 has an elliptical cross-section 204 seen in View A. The elliptical cross-section 204 of the beam 202 is preferable over a circular cross-section because, for a typical application of a tiltable MEMS micromirror device in a wavelength selective optical switch, many optical beams at different wavelength are positioned so as to have their cross-sections disposed along a common axis, in this case, the Y axis. Correspondingly, decreasing the cross-section of the optical beam 200 in a Y-direction is advantageous, since it allows one to accommodate more individual beams 200 and more mirrors 200 along the Y axis, thereby increasing the wavelength resolution of the wavelength selective switch device. However, decreasing the beam size in Y-direction increases the beam divergence in that direction. For example, by comparing projections of a reflected beam 206 in the Views B and C of FIG. 2, one can see that the beam 206 diverges more in the projection of View C than it does in the projection of View B. Increased divergence requires one to increase the tilt angle for a switching application since the beam must be steered by an angle exceeding the beam divergence angle. Thus, a minimum tilt angle $\theta_x$ for switching the optical beam by tilting about the X axis is larger than a minimum tilt angle $\theta_y$ for switching the optical beam by tilting about the Y axis.

A requirement for a comparatively large tilt angle about the X axis has important implications for a tiltable MEMS micromirror device. Referring back to FIG. 1, an ellipse 101 denotes the elliptical cross-section of an impinging optical beam. To steer said optical beam about the X axis, a voltage is applied to the electrode 114. Due to the electrode 114 being located closer to the X axis than the electrode 112 is to the Y axis, the created X-torque is smaller than the Y-torque created by applying a voltage to any one of the electrodes 112. To ensure a larger tilt angle as has been explained above, at a smaller torque, the X-hinges 110 are typically made much more "weak", or flexible, than the Y-hinges 106.

The flexible X-hinges 110 of the MEMS device 100 of the prior art are the weakest structures of the entire MEMS structure shown in FIG. 1. The flexibility of the X-hinges 110, although required for proper functioning of the device 100, leads to serious drawbacks inherent to the device 100. First, pistoning effects are significant due to the weaker X-hinges 110. When a voltage is applied between the platform 102 and one of the electrodes 112, and, or between the platform 102 and the electrode 114, the platform 102 shifts towards the electrodes 112 and 114, which changes the gap between the platform 102 and the electrodes 112 and 114, resulting in a change of sensitivity of the angle of tilt about the X and the Y axis to the voltage applied. This change of sensitivity leads to cross-coupling between the X and the Y tilts. Herein, the term "cross-coupling" is understood as mutual influence of X and Y actuation, that is, the actuation of tilt of the platform 102 about the X and the Y axes. Second, the X-hinges, being the weakest mechanical link in the entire MEMS device 100, lower the overall device reliability by making the device 100 more susceptible to shock and vibration. Third, manufacturing process related misalignments between the electrodes 112 and the X axis defined by the X-hinges 110 cause tilting the platform 102 about the X axis, or so called "roll", upon application of a voltage to one of the electrodes 112 to tilt the platform 102 about the Y axis. The weaker hinges 110 make this "rolling" effect more pronounced.

Yet another drawback of the MEMS device 100 of FIG. 1 is that, upon tilting the platform 102 about the X axis, the gap between the electrodes 112 and the platform 102 changes, not only due to pistoning, but also due to tilting of the platform 102 itself about the X axis. This results in a further increase of cross-coupling of the X and Y tilts of the platform 102 and changing of the actuator sensitivities upon applying a voltage to the electrode 114.

In addition to complicating calibration and control, the pistoning effect lowers reliability of optical switch devices based on MEMS micromirror devices, since micromirror perturbations caused by vibration and shock can impact the transfer characteristic of the MEMS devices, leading to degradation of optical characteristics of the optical switch devices, such as insertion loss and isolation.

It is therefore a goal of the present invention to provide a tiltable MEMS micromirror device, in which the cross-coupling and pistoning effects are reduced by an order of magnitude, as compared to prior-art devices.

The tiltable MEMS micromirror device of the present invention meets this goal. Advantageously, the area of the rotor and the stator electrodes of the MEMS device of the present invention may be further increased by at least 50%, without increasing micromirror size or spacing in a micromirror array. This results in a further improvement of reliability, since the increased actuator area results in an increase of the electrostatic force; therefore, stronger hinges may be used to support the micromirror, and stronger micromirror hinges enhance the overall reliability of the tiltable MEMS micromirror device.

SUMMARY OF THE INVENTION

In a two-axis tiltable MEMS device of the present invention, the hinges and the rotor electrodes are disposed so that the rotor electrode for tilting the platform about the first axis is not responsive to a tilt of the platform about the second axis, which greatly reduces the cross-coupling effects mentioned above. Further, a mechanical load due to actuation of the tilt about the first axis is decoupled from the hinge for tilting about the second axis. Decoupling of the loads of the two hinges considerably reduces the pistoning effect as well.

In accordance with the invention there is provided a micro-electro-mechanical (MEMS) device for pivotally supporting an optical element, comprising:

a substrate including an anchor post;

a first torsional hinge attached to the anchor post, rotatable about a first axis;

a gimbal structure surrounding the first torsional hinge, wherein opposite ends of the first torsional hinge are attached to opposite sides of the gimbal structure;

first and second actuator regions disposed on opposite sides of the first axis on opposite sides of the gimbal structure;

a second torsional hinge rotatable about a second axis perpendicular to the first axis, the second torsional hinge comprising first and second arms extending from the first and the second actuator regions, respectively;

a platform for supporting a reflective surface, connected to the second torsional hinge and tiltable about the first and the second axes, the platform having a third actuator region;

a first stator electrode positioned on the substrate beneath the first or the second actuator region, for tilting the gimbal structure and the platform about the first axis; and a second stator electrode positioned on the substrate beneath the third actuator region, for tilting the platform relative to the gimbal structure about the second axis.

In accordance with another aspect of the invention there is further provided a MEMS device for pivotally supporting an optical element, such as a micromirror, over a substrate that includes an anchor post, comprising:

a tiltable platform for supporting the optical element;

a first rotor electrode defined by a width and a length, having first and second regions and a brace extending therebetween;

a first torsional hinge defined by a width and a length, rotatable about a first axis, and extending between the anchor post and the brace;

a second torsional hinge rotatable about a second axis that is perpendicular to said first axis, and extending between the first rotor electrode and the tiltable platform;

a first stator electrode disposed on the substrate beneath the first or the second region of the first rotor electrode, for selectively controlling the tilt of the rotor electrode and of the platform about the first axis; and a second stator electrode positioned on the substrate beneath the tiltable platform, for selectively controlling the tilt of the platform about the second axis by using the tiltable platform as a second rotor electrode;

wherein the total width of the first and the second stator electrodes is less than the width of the platform;

whereby a plurality of the platforms pivotable about the first axis and the second axis are positionable in close proximity with only an air gap between adjacent platforms.

In accordance with another aspect of the invention there is further provided a linear array of said MEMS devices on a common substrate for supporting the anchor posts and the first and the second stator electrodes of the individual MEMS devices;

wherein the platforms of the individual MEMS devices are substantially coplanar and are spaced apart along an array axis, wherein the first axes of the individual MEMS devices are parallel to each other and to the array axis, and wherein the second axes of the individual MEMS devices are parallel to each other and perpendicular to the array axis.

In accordance with yet another aspect of the invention there is further provided a wavelength selective switch (WSS) module for wavelength selective switching of individual wavelength channels between an input port thereof and a plurality of output ports thereof, the WSS module comprising:

a wavelength dispersive element for spatially separating individual wavelength channels along a line of dispersion;

a linear array of MEMS devices having micromirrors attached to the tiltable platforms of the MEMS devices, wherein the micromirrors are disposed along the line of dispersion, for redirecting the individual wavelength channels in dependence upon angles of tilt of said micromirrors; and a coupler for optically coupling the input port to the wavelength dispersive element; the wavelength dispersive element to the micromirrors; the micromirrors back to the wavelength dispersive element; and the wavelength dispersive element to the plurality of output ports, so as to couple the individual wavelength channels to any one of the plurality of the output ports, in dependence upon angles of tilt of individual micromirrors.

BRIEF DESCRIPTION OF THE DRAWINGS

Exemplary embodiments will now be described in conjunction with the drawings in which:

FIGS. 3A to 3L are views of various embodiments of a two-axis tiltable MEMS device according to the present invention;

DETAILED DESCRIPTION OF THE INVENTION

While the present teachings are described in conjunction with various embodiments and examples, it is not intended that the present teachings be limited to such embodiments. On the contrary, the present teachings encompass various alternatives, modifications and equivalents, as will be appreciated by those of skill in the art.

Figure 3A:
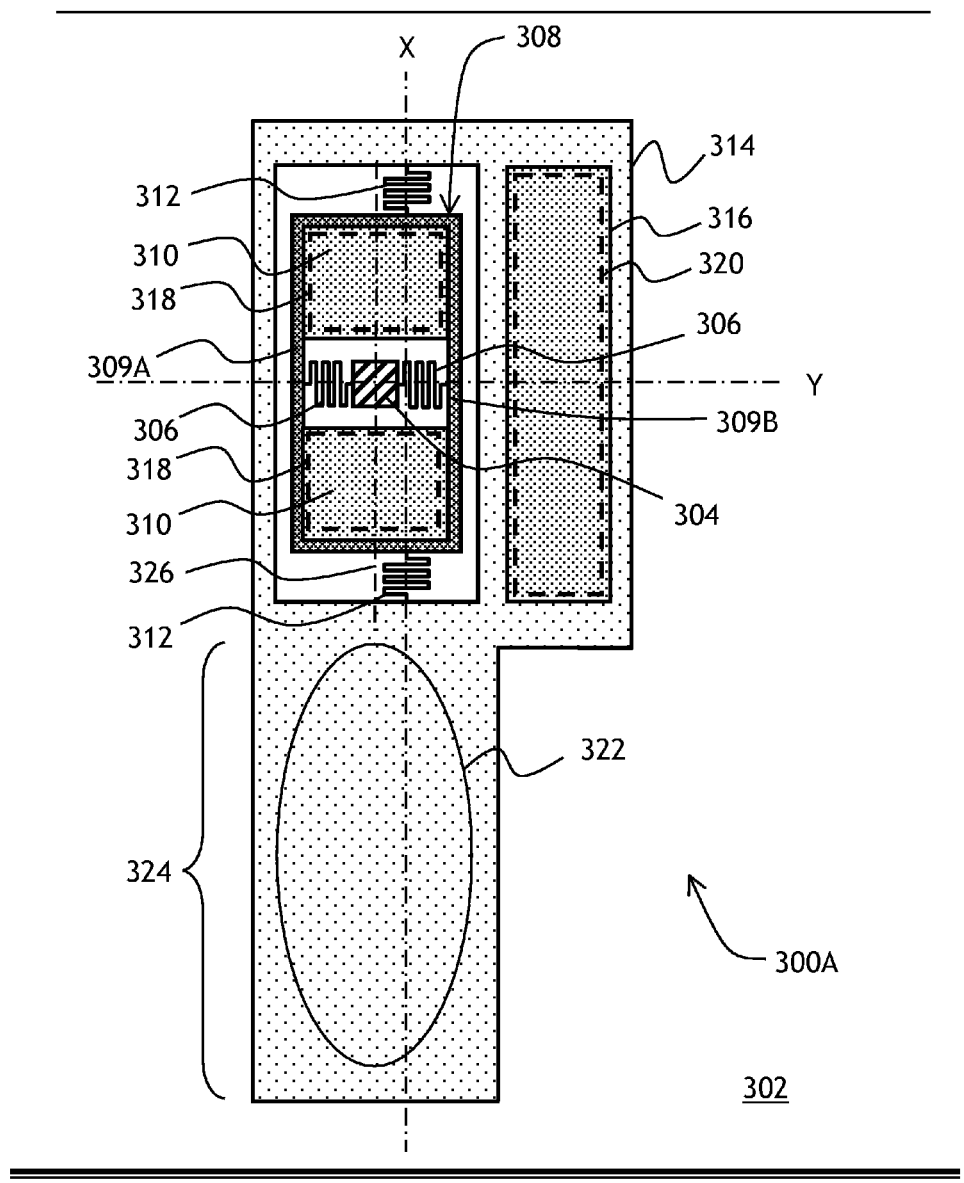

Referring to FIG. 3A, a plan view of a two-axis tiltable MEMS device 300A according to an exemplary embodiment of the present invention, alleviating the drawbacks of the prior art device 100, is shown. The MEMS device 300A has a substrate 302 including an anchor post 304 extending from the substrate 302. A first torsional serpentine hinge 306 is attached to the anchor post 304 and is rotatable about a Y axis. A gimbal structure 308 surrounds the first torsional hinge 306, opposite ends of the first torsional hinge 306 being attached to opposite sides of the gimbal structure 308. Y-actuator regions 310 are disposed on opposite sides of the Y axis on opposite sides of the gimbal structure 308 as shown. A second torsional serpentine hinge 312, rotatable about an X axis perpendicular to the Y axis, extends from the Y-actuator regions 310. A platform 314 is connected to the second torsional hinge 312 and is tiltable about the Y and the X axes. The platform 314 has an X-actuator region 316, for tilting the platform 314 about the X axis. Y-electrodes 318 are positioned on the substrate 302 beneath the Y-actuator regions 310. Their function is to tilt the gimbal structure 308 and the platform 314 about the Y-axis in both directions. An X-electrode 320 is positioned on the substrate 302 beneath the X-actuator region 316. Its function is to tilt the platform 314 relative to the gimbal structure 308 about the X axis. The Y-actuator regions 310 may be viewed as Y-rotor electrodes for tilting the gimbal structure 308 and the platform 314 about the Y axis, wherein the two regions 310 are connected by a brace in form of two beams 309A and 309B. Similarly, the region 316 of the platform 314 may be viewed as an X-rotor electrode, the electrode 320 being the X-stator electrode.

One Y-stator electrode 318 may be used with the present invention; however, two Y-stator electrodes 318 are preferably used as shown in FIG. 3A because two Y-stator electrodes 318 can be used for tilting the platform 314 in both directions, which effectively doubles the Y-tilting range of the platform 314.

Preferably, the upper surfaces of the torsional hinges 306 and 312, the gimbal structure 308, the actuator regions 310 and 316, and the platform 314 are all coplanar, thereby facilitating manufacture, because all these structures can be formed from a single silicon layer using, for example, the above mentioned technique of deep reactive ion etching of a single silicon layer. Further, preferably, the actuator regions 310 and 316 are all electrically coupled, thereby comprising a ground electrode of the MEMS device 300A, so that in operation, the platform 314 is tilted about the Y axis upon applying a voltage between one of the Y-stator electrodes 318 and the ground electrode, and the platform 314 is tilted about the X axis upon applying a voltage between the X-stator electrode 320 and the ground electrode. To achieve a high reflectivity, a region 324 of the platform 314, or the entire platform 314 for that matter, is coated with a mirror coating. When thereby formed micromirror is tilted, an optical beam having a cross-section 322 is steered about the X and Y axes.

Figure 1:
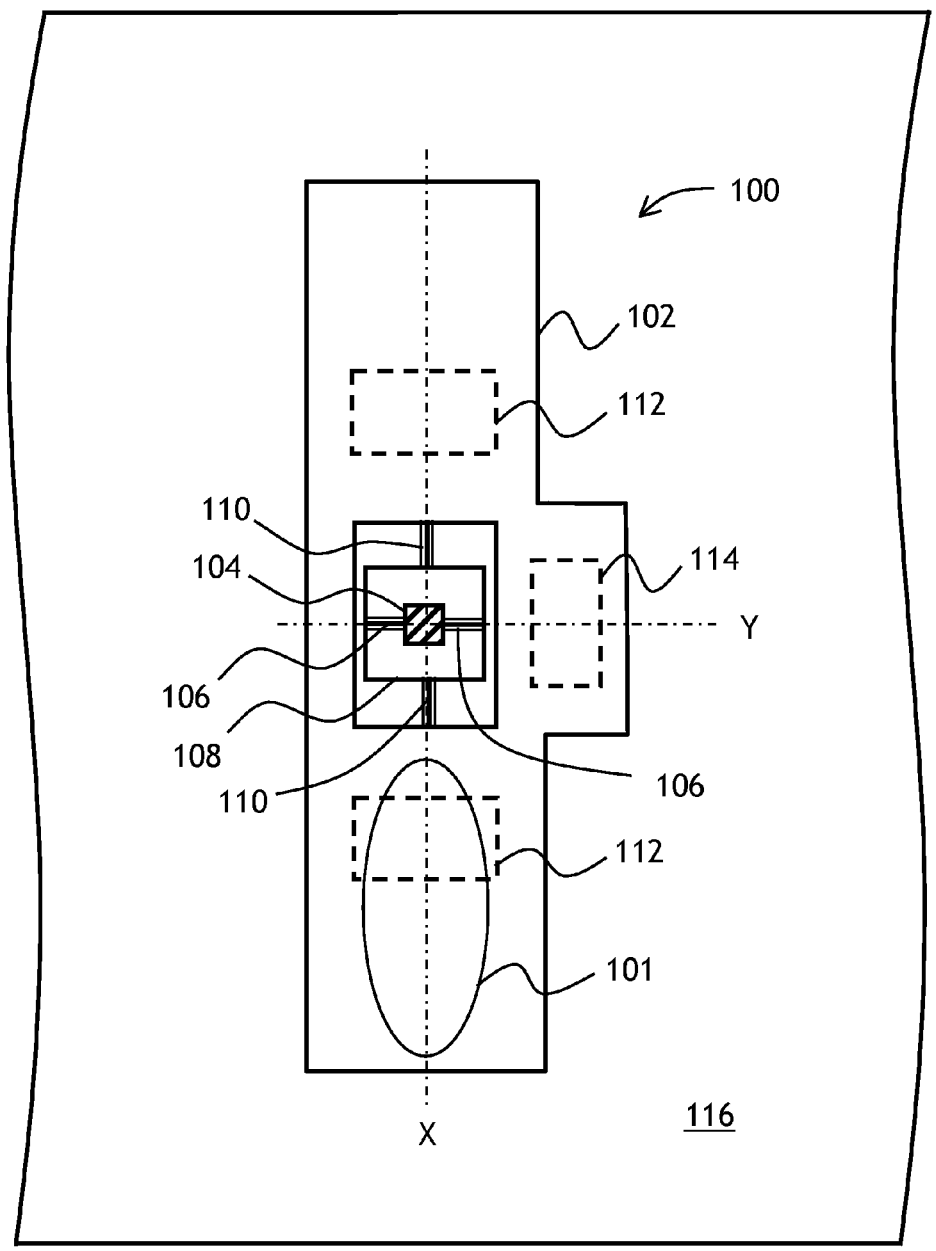
FIG. 1 is a plan view of a prior-art tiltable MEMS device.
Figure 2:
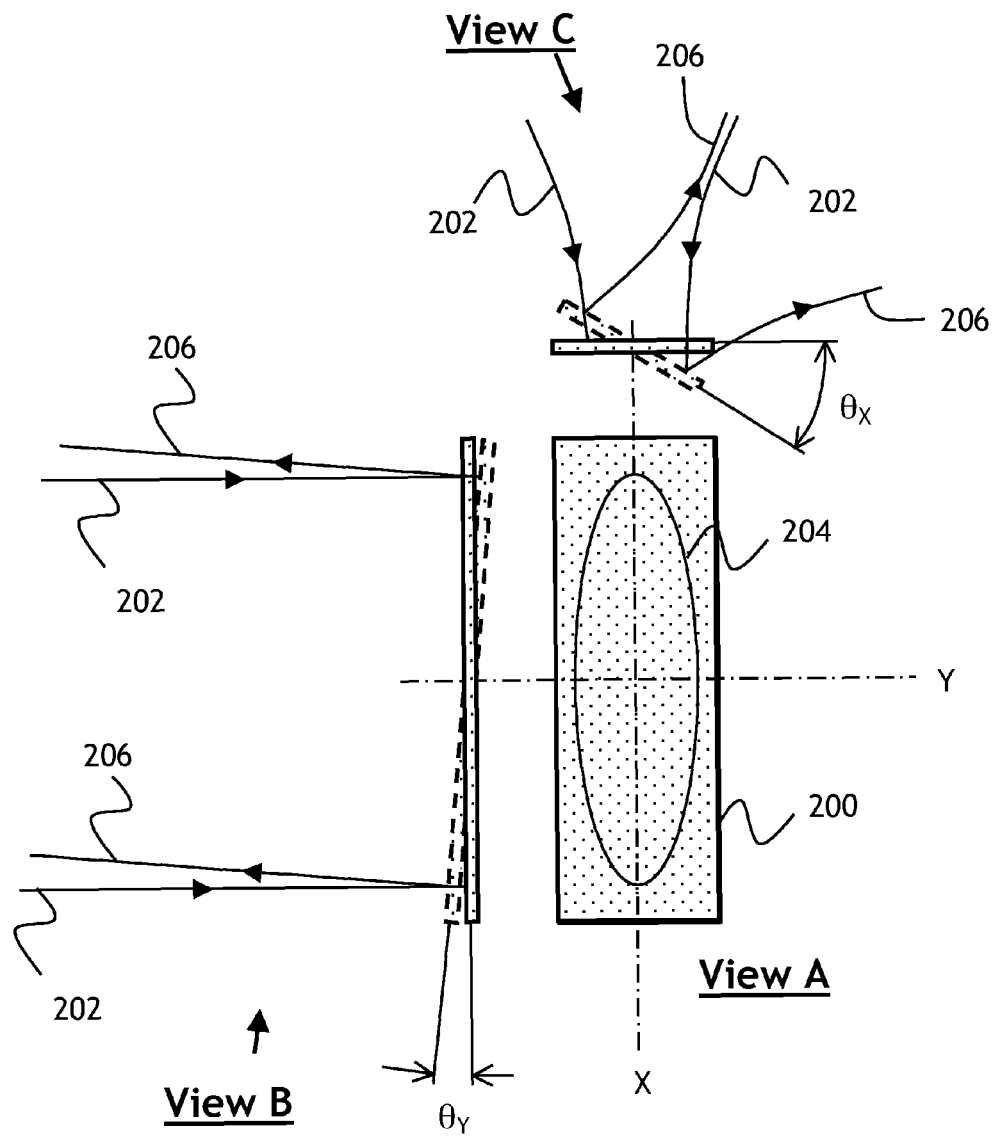
FIG. 2 is an orthographic projection view of a prior-art two-axis tiltable MEMS micromirror.

In the MEMS device 300A, the Y-actuator regions 310 are mechanically decoupled from a tilt of the platform 314 about the X-axis. This arrangement provides for a much higher mechanical stability as compared to the MEMS device 100 of FIG. 1 because in the device 300A of FIG. 3A, only the stronger Y-hinge determines the magnitude of shift of the Y-actuator regions 310, or pistoning of said regions 310, upon applying a voltage to the Y-stator electrodes 318. Preferably, a spring constant of the Y-hinge 306 is larger than a spring constant of the X-hinge 312 by approximately an order of magnitude, whereby a magnitude of a shift of the platform 314 towards the Y-stator electrode 318 upon application of a voltage to the Y-stator electrode 318 is at least 10 times less than a magnitude of a shift of the platform 314 towards the X-stator electrode 320 upon application of the same voltage to the X-stator electrode 320. The shift of the platform 314 is typically less than 0.05 microns.

The tilt cross-coupling due to misalignments of positions of the electrodes 318 and 320 relative to the X and the Y axes is also reduced, because in the MEMS device 300A, it is mostly the stronger Y-hinge 306 that determines a magnitude of such cross-coupling. Preferably, the spring constants of the X-hinge 312 and of the Y-hinge 306 are selected so that a magnitude of tilt of the platform 314 about the X axis upon application of a voltage to the Y-stator electrode is at least 10 times less than a magnitude of the platform 314 tilt about the Y-axis upon application of the same voltage to the Y-stator electrode. The X-tilt upon application of a voltage to one of the Y-stator electrodes 318 also depends on a distance between an axis of symmetry 326 of the Y-stator electrodes 318 and the X-axis. At a typical misalignment of 2 microns between the axis 326 and the X-axis, the X-tilt is less than 0.5% of the Y-tilt. It should be noted that the axis 326 and the X-axis can be deliberately offset with respect to each other, so as to balance the weight of the platform 314, having the mirror region 324, about the X axis and, or optimize geometry of the electrodes 318 and 320. For example, in FIG. 3A, the axis 326 and the X axis are offset so that the distance between the axis 326 and the X axis is more than one tenth of the width of the Y-electrode 318 measured along the Y axis. Even at an offset between the axis 326 and the X axis of between 10 microns and 50 microns, the undesired X-tilt occurring upon application of a voltage to the Y-stator electrode 318 is still 10 times less than the Y-tilt, due to increased strength of the Y-hinge 306.

The positioning of the Y-actuator regions 310 within the gimbal structure 308, with the platform 314 being suspended to the gimbal structure 308 by the weaker X-hinge 312, greatly reduces the influence of X-actuation on Y-tilt of the platform 314. When the platform 314 is tilted about the Y-axis upon application of a voltage to one of the Y-electrodes 318, the further tilt of the platform 314 about the Y-axis upon further application of the same voltage to the X-electrode 320 is much less than the original Y-tilt due to application of the voltage to the Y-electrodes 318. Furthermore, the area of the X-stator electrode 320 can be increased by up to 50% as compared to the area of the prior-art MEMS device 100, since the MEMS device structure of FIG. 3A provides more room for the X-stator electrode 320. Thus, the X-hinge 312 can be further strengthened, which, unexpectedly and advantageously, improves overall reliability of the MEMS device 300A.

Figures 3B, 3C:
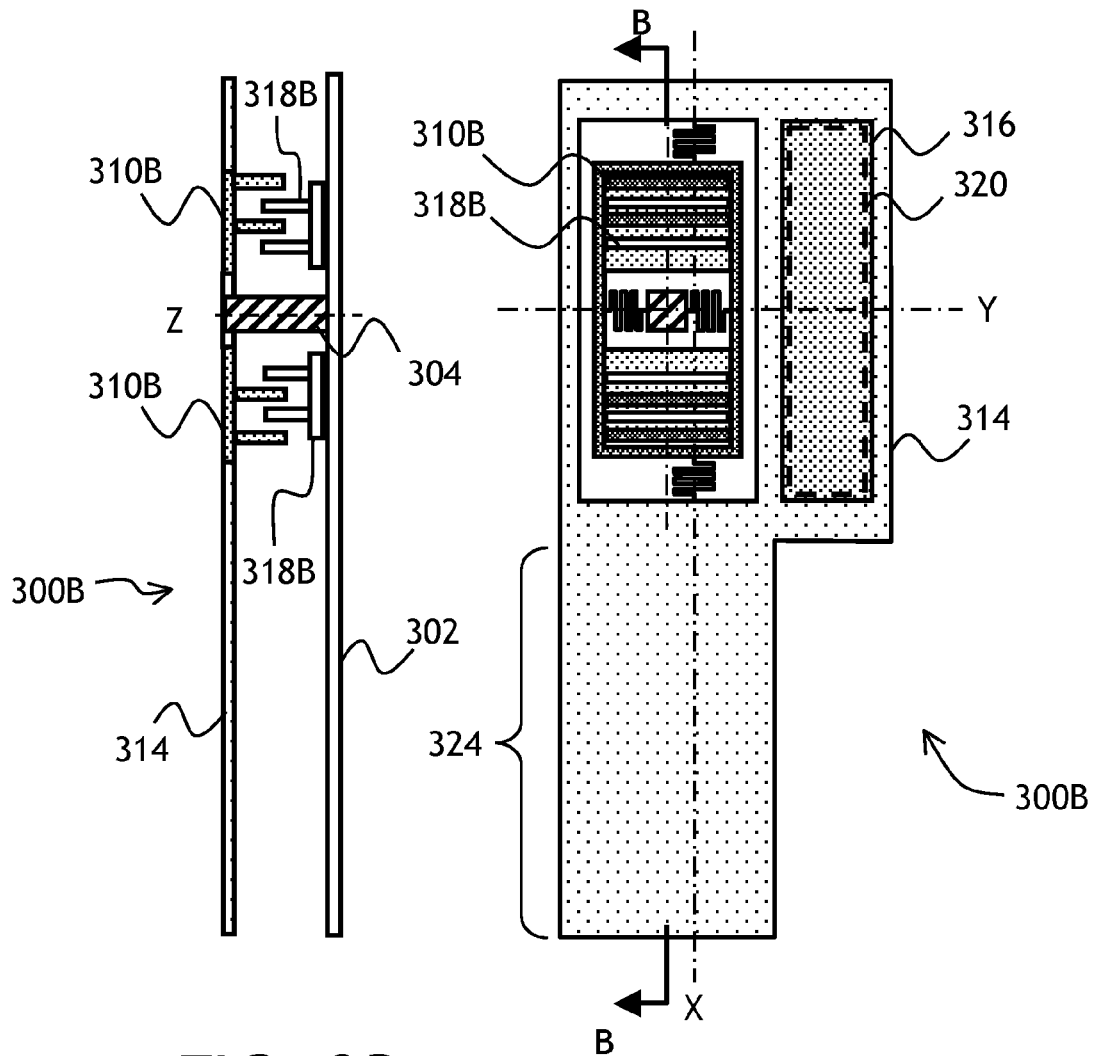

Referring now to FIGS. 3B and 3C, a plan view of a two-axis tiltable MEMS device 300B according to another preferred embodiment of the present invention is shown. The MEMS device 300B has the same elements as the device 300A with the exception that the platform 314 is tilted about the Y axis by a rotor comb electrode 310B, which is attracted to a stator comb electrode 318B upon applying a voltage therebetween. The rotor comb electrodes 310B and the stator comb electrodes 318B are planar parallel plates that are interdigitated as shown in View B-B of FIG. 3B. These planar parallel plates are parallel to the Y axis and spaced apart along the X axis. Such an orientation of the rotor and stator plates 310B and 318B is beneficial, because the lateral attraction between the rotor and the stator plates, resulting from a misalignment therebetween, creates a negligible momentum about a Z axis shown in View B-B of FIG. 3B. The negligible Z-momentum facilitates prevention of rotation of the platform 314 in its own plane, that is, about the Z-axis, whereby a plurality of platforms 314 can be placed close to each other, without running a risk of a collision between neighboring platforms 314.

Figure 3D:
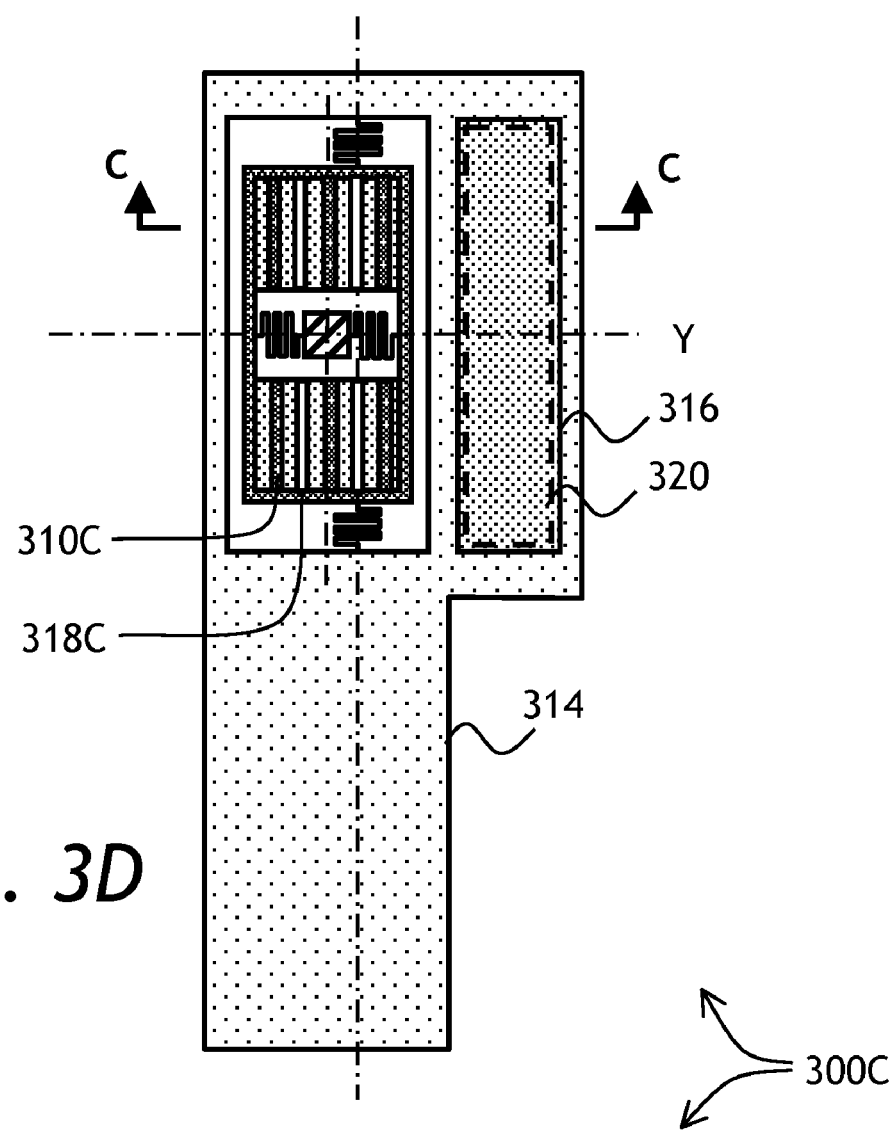
Figure 3E:
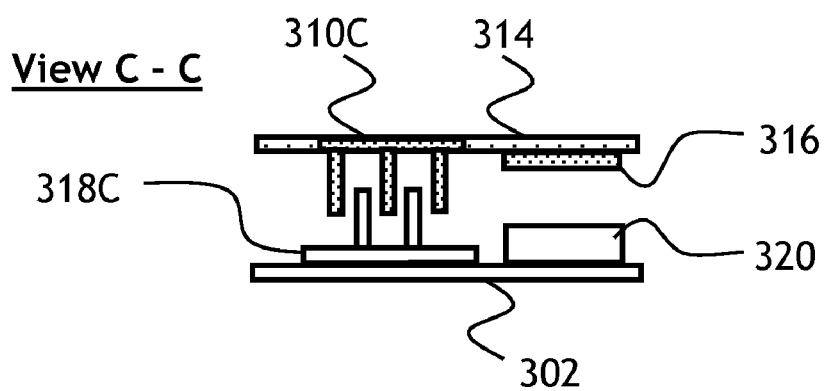
Figure 3F:
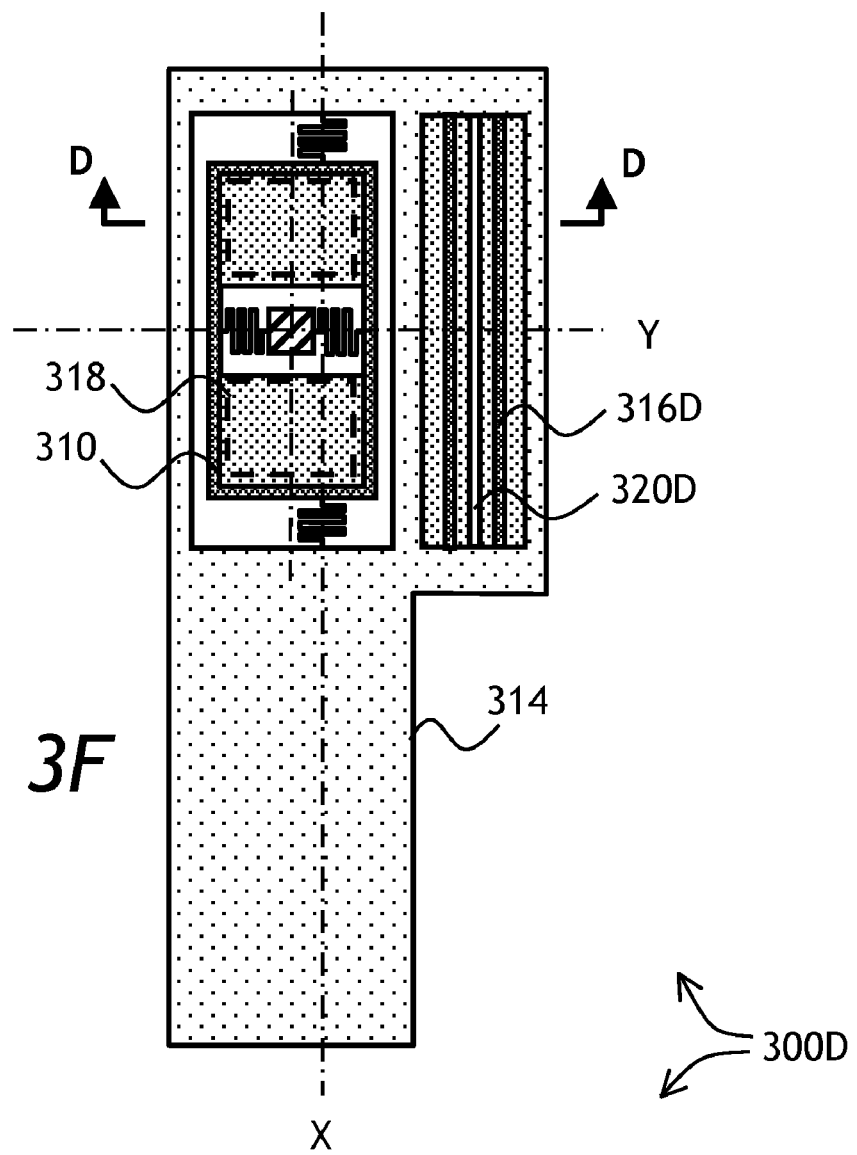
Figure 3G:
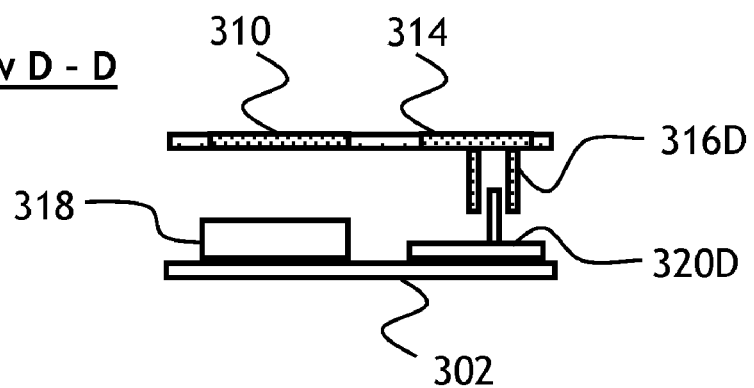
Figures 3H, 3I:
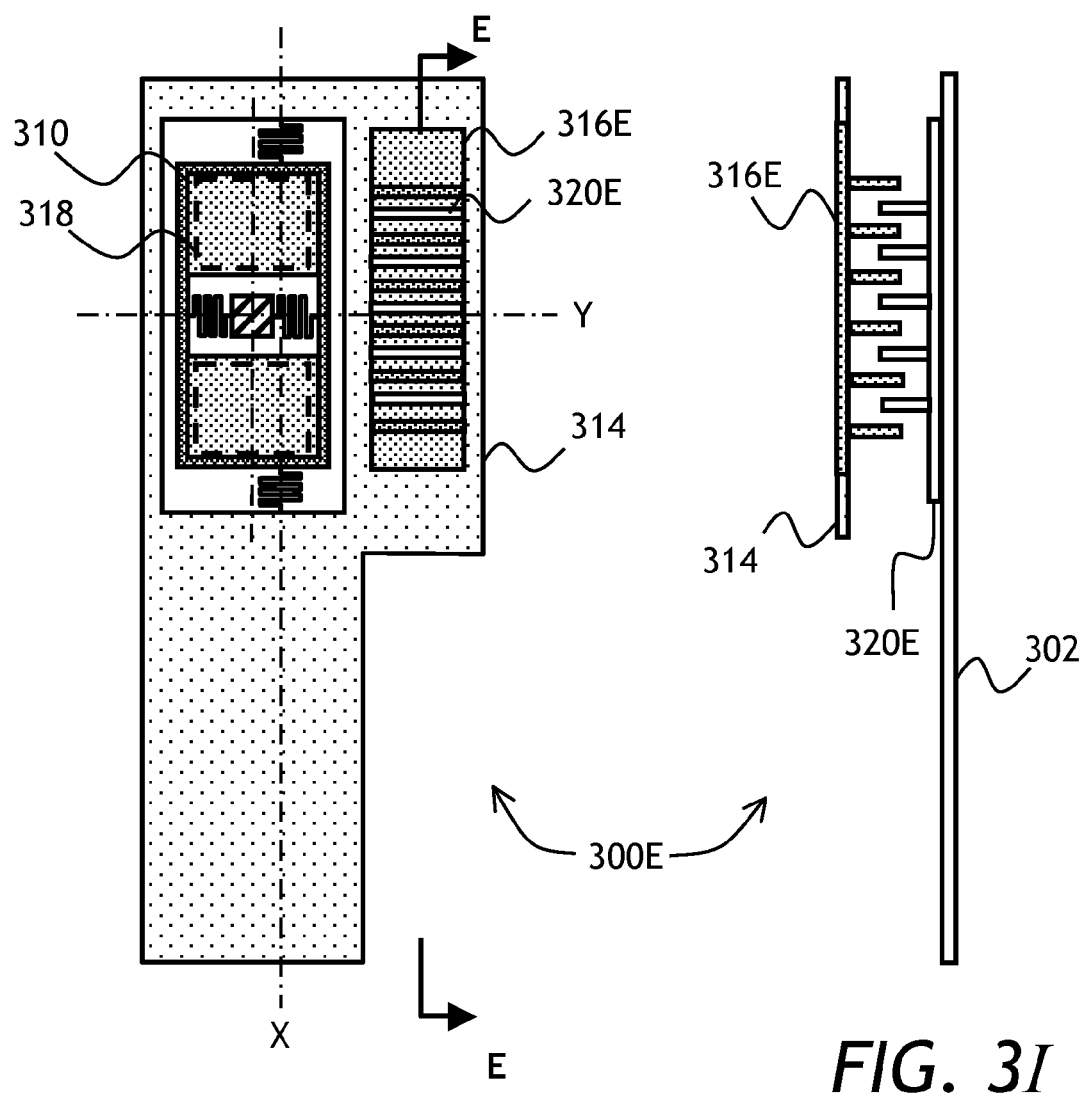

Referring now to FIGS. 3D and 3E, a MEMS device 300C differs from the MEMS device 300B by position and orientation of plates of rotor and stator comb electrodes 310C and 318C, respectively. In FIGS. 3D and 3E, the rotor comb electrodes 310C and the stator comb electrodes 310C are planar parallel plates parallel to the X axis, spaced apart along the Y axis, and interdigitated as shown in View C-C of FIG. 3E. The advantage of this orientation is that during tilting about the Y axis, the plates 310C and 318C remain parallel to each other, allowing for a denser comb teeth spacing and, therefore, stronger actuation forces.

Turning now to FIGS. 3F, 3G and FIGS. 3H, 3I, the corresponding MEMS devices 300D and 300E have comb rotor electrodes 316D and 316E interdigitated with comb stator electrodes 320D and 320E, for X-tilting of the platform 314 upon applying a voltage between the corresponding rotor and the stator comb electrodes. Similarly to MEMS devices 300B and 300C, each of the embodiments 320D and 320E has its own advantage: while the MEMS device 300D has an advantage of a negligible Z-torque upon X-actuation, in the MEMS device 300E, the rotor and the stator electrode plates 316E and 320E stay parallel to each other during the X-actuation.

Referring now to FIGS. 3J, 3K, and 3L, an embodiment 300F of a MEMS tiltable device is shown wherein both X- and Y-actuators have pairs of corresponding comb electrodes: the rotor and the stator electrodes 310B and 318B for Y-tilt actuation, seen in View G-G of FIG. 3J, and the rotor and the stator electrodes 316D and 320D for X-tilt actuation, seen in View F-F of FIG. 3L.

Possible modifications of the MEMS device 300A to 300F include modifications of shape of the platform 314, of the X- and Y-actuator regions 310 and 316, replacement of a mirror coating of the platform 314 with another optical element, such as a micro-prism, as well as replacement of serpentine hinges 306 and 312 with other types of hinges. It is to be understood, however, that such modifications fall within the scope of the present invention.

Figure 4:
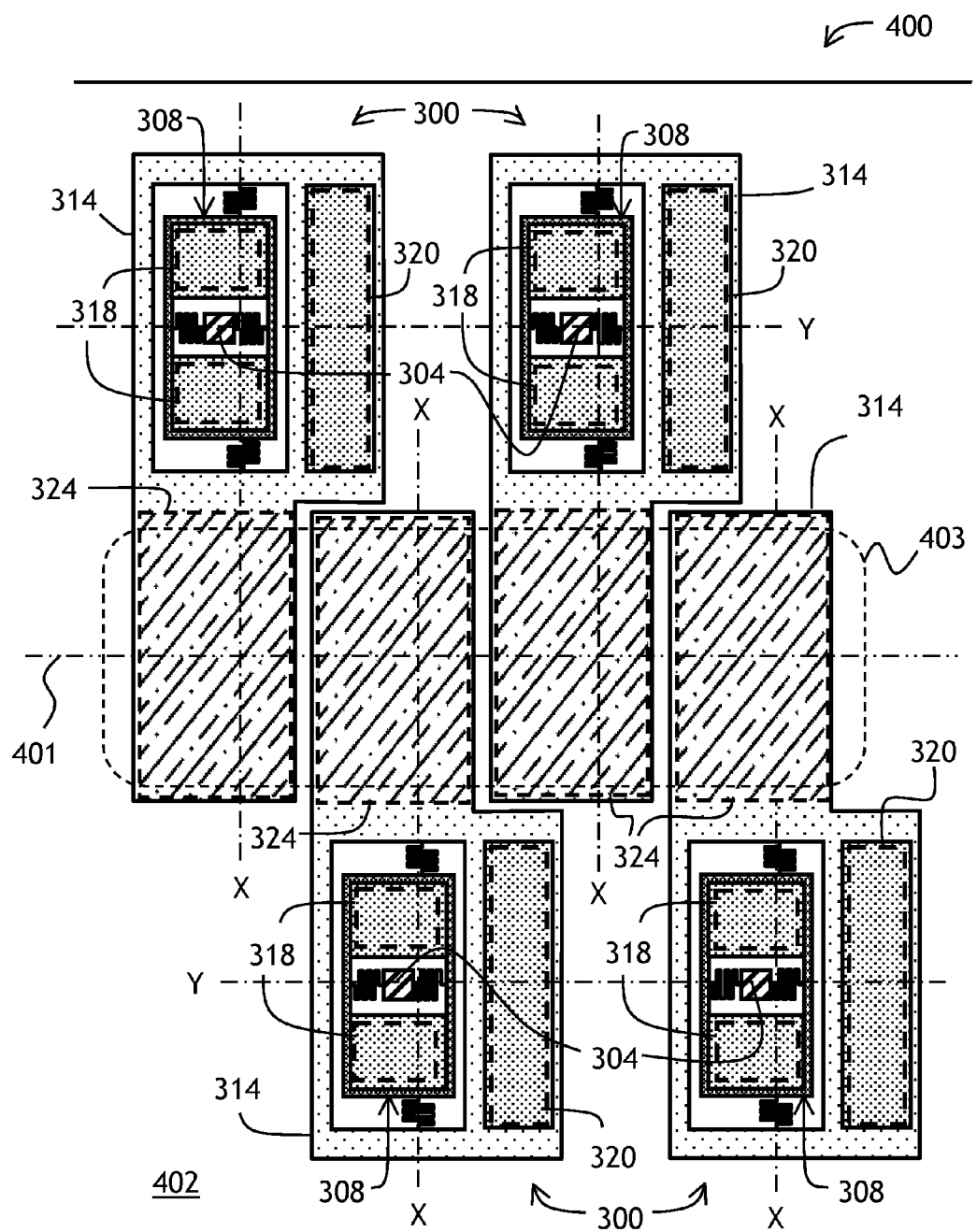
FIG. 4 is a plan view of an interlaced array of the two-axis tiltable MEMS devices of the present invention.

Referring now to FIG. 4, an array 400 of two-axis tiltable MEMS devices 300 according to the present invention is shown. Any MEMS device 300A to 300F is usable as the device 300 for forming the array 400. The individual MEMS devices 300 are disposed over a common substrate 402 supporting the anchor posts 304 and the X- and the Y-electrodes 318 and 320, respectively, of the individual MEMS devices 300. The platforms 314 of the individual MEMS devices 300 are substantially coplanar and are spaced apart along an array axis 401, the Y-axes of every second MEMS device 300 in the array 400 being coaxial and parallel to the array axis 401. The X-axes of the individual MEMS devices 300 are parallel to each other and perpendicular to the array axis 401. In FIG. 4, the gimbal structures 308 of adjacent MEMS devices 300 are disposed on opposite sides of the array axis 401, to provide more room for the X- and Y-electrodes 318 and 320 and to reduce electric coupling therebetween. The mirror regions 324 of the platforms 314 are preferably rectangular, and the width of individual regions, measured along the Y axis, is more than one half of the sum of widths of individual stator electrodes 318 and 320, whereby a plurality of MEMS devices are positionable in close proximity with only an air gap between adjacent mirror supporting regions 324 of said devices, as is seen in FIG. 4. One advantage of the interlaced disposition of individual MEMS devices as is shown in FIG. 4 is that the X-stator electrodes 320 are separated from the Y-stator electrodes 318 of a neighboring MEMS devices 300 by a distance that is sufficient to overcome an electrical crosstalk between a stator electrode of one MEMS device 300 and a rotor electrode of a neighboring MEMS device 300. The mirror regions 324 of each individual MEMS device 300 form an optical area 403 of the array 400, the optical area 403 being symmetrical about the array axis 401 and the mirror regions 324 being disposed in close proximity one to another, with only air gap therebetween. The array 400 is preferably hermetically sealed and purged with nitrogen to increase reliability. Therefore, the term "air gap" is understood herein as any gaseous gap or even a vacuum gap.

One preferred area of application of the MEMS array 400 of FIG. 4 is optical fiber communications. An information carrying optical signal typically has many "wavelength channels", or optical signals at individual wavelengths, that are modulated at a very high clock frequency, for example at 10 GHz or 40 GHz. By providing for switching of some of these wavelength channels between various optical paths of an optical network while letting some other wavelength channels propagate along their original paths, significant cost savings, related to both the deployment and the exploitation of the network, can be achieved. This wavelength switching function can be advantageously provided by a MEMS array of the present invention, as follows.

Figure 5:
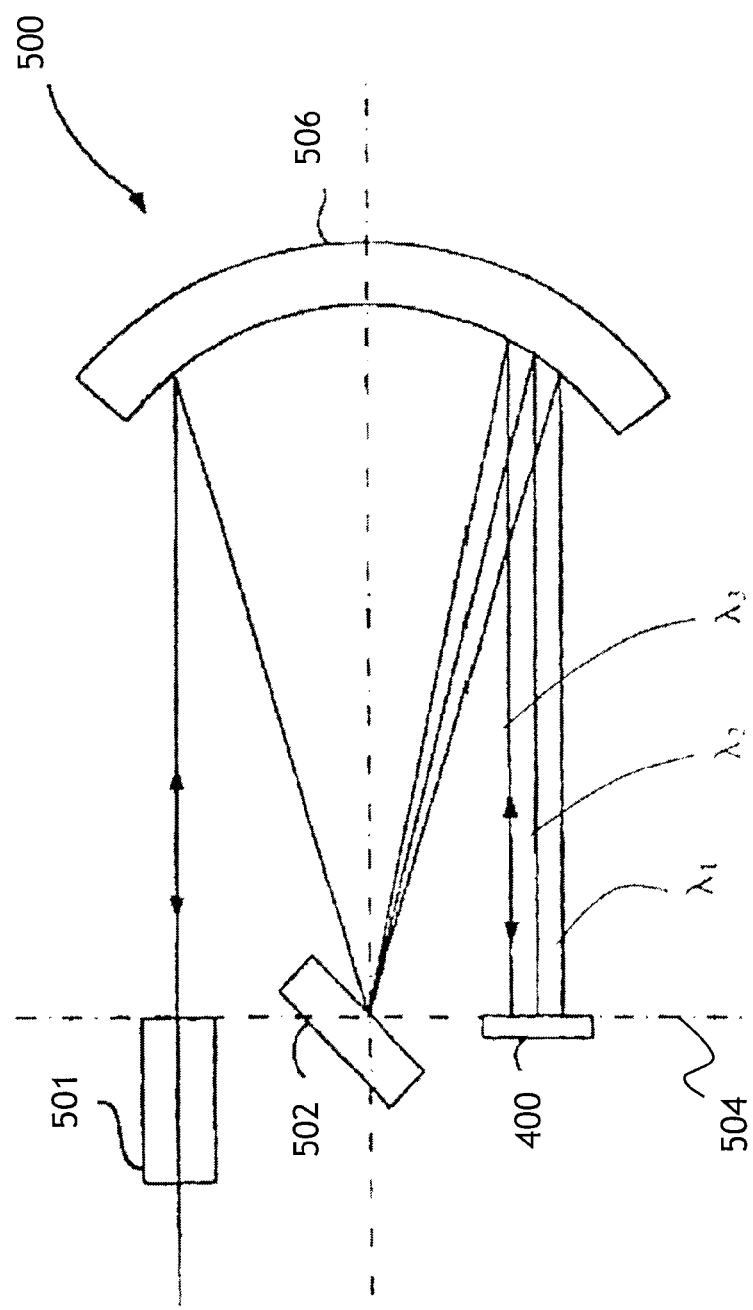
FIG. 5 is a plan view of a wavelength selective switch (WSS) module using the MEMS device array of FIG. 4.

Turning now to FIG. 5, a wavelength selective switch (WSS) module 500 for wavelength selective switching of individual wavelength channels of an input optical signal is presented. The WSS module 500 uses the MEMS array 400 of the present invention, to switch the wavelength channels between an input port and a plurality of output ports. The WSS module 500 has a front end 501 having integrated therein the input port and the plurality of output ports. A diffraction grating 502 is used for spatially separating individual wavelength channels along a line of dispersion 504. The optical area 403 of the MEMS array 400 is disposed along the line of dispersion 504. The MEMS array 400 is used for redirecting the individual wavelength channels at wavelengths $\lambda_1$, $\lambda_2$, and $\lambda_3$ in dependence upon angles of tilt of the reflective surfaces 324 of individual MEMS devices 300 comprising the MEMS array 400. A concave mirror 506 is used for optically coupling the input port of the front end 501 to the diffraction grating 502; the diffraction grating 502 to the MEMS array 400; the MEMS array 400 back to the diffraction grating 502; and the diffraction grating 502 to the plurality of output ports disposed in the front end 501. The individual wavelength channels are coupled to any one of the plurality of the output ports, in dependence upon angles of tilt of the reflective surfaces 324 of individual MEMS devices 300 comprising the MEMS array 400.

It is recognized by those of skill in the art that the diffraction grating 502 can be replaced by another wavelength dispersive element such as a grism, for example; further, the concave mirror 506 can be replaced by another suitable optical coupler, such as a lens and a flat mirror. All such modification are within the scope of the present invention. A more detailed description of construction and function of a WSS such as the WSS 500 of FIG. 5 can be found in U.S. Pat. No. 6,498,872 by Bouevitch et al., U.S. Pat. No. 6,707,959 by Ducellier et al., and U.S. Pat. No. 7,014,326 by Danagher et al., all of which are assigned to JDS Uniphase Corporation and are incorporated herein by reference.

What is claimed is:

1. A micro-electro-mechanical (MEMS) device for pivotally supporting an optical element over a substrate that includes an anchor post, comprising:
   a tiltable platform for supporting the optical element;
   a first rotor electrode defined by a width and a length, having first and second regions and a brace extending therebetween;
   a first torsional hinge defined by a width and a length, rotatable about a first axis, and extending between the anchor post and the brace;
   a second torsional hinge rotatable about a second axis perpendicular to the first axis, and extending between the first rotor electrode and the tiltable platform;
   a first stator electrode disposed on the substrate beneath the first or the second region of the first rotor electrode, for selectively controlling the tilt of the rotor electrode and the platform about the first axis; and
   a second stator electrode positioned on the substrate beneath the tiltable platform, for selectively controlling the tilt of the platform about the second axis by using at least a part of the tiltable platform as a second rotor electrode;
   wherein the total width of the first and the second stator electrodes is less than the width of the platform;
   whereby a plurality of the platforms pivotable about the first axis and the second axis are positionable in close proximity with only an air gap between adjacent platforms.

2. The MEMS device of claim 1, wherein the platform has a supporting region for pivotally supporting the optical element over the substrate.

3. The MEMS device of claim 2, wherein the supporting region and the first and the second stator electrodes each have a width measured along the first axis,
   wherein the width of the supporting region is larger than one half of the total width of the first and the second stator electrodes,
   whereby a plurality of the MEMS devices are positionable in close proximity with only an air gap between adjacent supporting regions of the MEMS devices.

4. The MEMS device of claim 1, wherein at least one of the first or the second regions of the first rotor electrode comprises a rotor comb electrode, and the first stator electrode comprises a stator comb electrode interdigitated with the rotor comb electrode.

5. The MEMS device of claim 4, wherein at least one of the rotor comb electrode or the stator comb electrode comprises comb elements spaced apart along the second axis.

6. The MEMS device of claim 1, wherein the part of the tiltable platform used as the second rotor electrode comprises a rotor comb electrode, and the second stator electrode comprises a stator comb electrode interdigitated with the rotor comb electrode.

7. The MEMS device of claim 6, wherein at least one of the rotor comb electrode or the stator comb electrode comprises comb elements spaced apart along the first axis.

8. The MEMS device of claim 3, further comprising a micromirror disposed upon the supporting region.

9. The MEMS device of claim 1, wherein upper surfaces of the first and the second torsional hinges, the brace, the first rotor electrode, and the platform are all coplanar, thereby facilitating manufacture.

10. The MEMS device of claim 1,
wherein the first rotor electrode and the tiltable platform are electrically coupled, thereby comprising a ground electrode of the MEMS device, and
wherein in operation, the platform is tilted about the first axis upon applying a voltage between the first stator electrode and the ground electrode; and the platform is tilted about the second axis upon applying a voltage between the second stator electrode and the ground electrode.

11. The MEMS device of claim 10,
wherein the first torsional hinge and the second torsional hinge each have a spring constant, the spring constant of the first torsional hinge being larger than the spring constant of the second torsional hinge,
whereby a magnitude of a shift of the platform towards the first stator electrode upon application of a first voltage to the first stator electrode is at least 10 times less than a magnitude of a shift of the platform towards the second stator electrode upon application of the first voltage to the second stator electrode.

12. The MEMS device of claim 10,
wherein the first torsional hinge and the second torsional hinge each have a spring constant, the spring constant of the first torsional hinge being larger than the spring constant of the second torsional hinge,
whereby a magnitude of the platform tilt about the second axis upon application of a first voltage to the first stator electrode is at least 10 times less than a magnitude of the platform tilt about the first axis upon application of the first voltage to the first stator electrode.

13. The MEMS device of claim 1, wherein the first and the second torsional hinges each include a serpentine hinge.

14. The MEMS device of claim 8,
wherein the platform and the micromirror have a total weight,
wherein the second torsional hinge is disposed offset from an axis of symmetry of the first rotor electrode, so as to balance the total weight of the platform and the micromirror about the second axis.

15. The MEMS device of claim 14, wherein the first stator electrode has an axis of symmetry parallel to the second axis, and a width measured along the first axis, wherein the distance between the axis of symmetry of the first stator electrode and the second axis is more than one tenth of the width of the first stator electrode.

16. A linear array of the MEMS devices of claim 8 on a common substrate for supporting the anchor posts and the first and the second stator electrodes of the individual MEMS devices;
wherein the platforms of the individual MEMS devices are substantially coplanar and are spaced apart along an array axis,
wherein the first axes of the individual MEMS devices are parallel to each other and to the array axis, and
wherein the second axes of the individual MEMS devices are parallel to each other and perpendicular to the array axis.

17. The linear array of MEMS devices of claim 16, wherein the first rotor electrodes of adjacent MEMS devices are disposed on opposite sides of the array axis, so that the first axes of every second mirror are coaxial.

18. A wavelength selective switch (WSS) module for wavelength selective switching of individual wavelength channels between an input port thereof and a plurality of output ports thereof, the WSS module comprising:
a wavelength dispersive element for spatially separating individual wavelength channels along a line of dispersion;
the linear MEMS devices array of claim 16, wherein the micromirrors of the MEMS devices are disposed along the line of dispersion, for redirecting the individual wavelength channels in dependence upon angles of tilt of the micromirrors; and
a coupler for optically coupling the input port to the wavelength dispersive element; the wavelength dispersive element to the micromirrors of the linear array of the MEMS devices; the micromirrors of the MEMS devices back to the wavelength dispersive element; and the wavelength dispersive element to the plurality of output ports, so as to couple the individual wavelength channels to any one of the plurality of the output ports, in dependence upon angles of tilt of the micromirrors.

19. The WSS module of claim 18, wherein the wavelength dispersive element is a diffraction grating, and wherein the coupler is a concave mirror.

* * * * *